United States Patent [19]
Hayashi

[11] Patent Number: 5,381,100
[45] Date of Patent: Jan. 10, 1995

[54] PULSE SIGNAL MEASURING INSTRUMENT

[75] Inventor: Mishio Hayashi, Tokyo, Japan

[73] Assignee: Advantest Corporation, Tokyo, Japan

[21] Appl. No.: 138,460

[22] Filed: Oct. 15, 1993

[30] Foreign Application Priority Data

Oct. 16, 1992 [JP] Japan ............................ 4-072410[U]

[51] Int. Cl.⁶ ............................................. G04F 10/00
[52] U.S. Cl. .................... 324/601; 324/617;
 324/76.82; 327/31; 327/39
[58] Field of Search ............... 307/517, 234, 603, 265,
 307/266, 267, 591; 324/617, 601, 76.77, 76.82,
 76.54, 76.55

[56] References Cited

U.S. PATENT DOCUMENTS

| 3,505,593 | 4/1970 | Gram | 324/617 |
| 4,146,835 | 3/1979 | Chnapko | 324/617 |
| 4,703,251 | 10/1987 | Baumgartner | 324/617 |

FOREIGN PATENT DOCUMENTS

62-294993 12/1987 Japan .
63-3272 1/1988 Japan .
63-191970 8/1988 Japan .

*Primary Examiner*—Louis Arana
*Assistant Examiner*—Jose M. Solis
*Attorney, Agent, or Firm*—Knobbe, Martens, Olson & Bear

[57] ABSTRACT

A working system comprises a machining center numerically controlled, a pallet stocker disposed in the vicinity of the machining center and storing a number of pallets therein, a preparatory station for setting-up work on a pallet, a conveying unit for automatically conveying the pallet from the pallet stocker to the preparatory station or the machining center, and a control apparatus for controlling an operation of the working system. The operation control apparatus comprises a control unit provided for the machining center and including a numerical control (NC) section executing instructions regarding various items on a working schedule and also including a MPU section executing a schedule data management, a preparatory operation board disposed in association with the preparatory station, a control board operatively connected to the control unit provided for the machining center and adapted to receive the conveying instructions to the pallets and the pallet status information, to transmit the pallet status displaying instruction and the pallet conveying operation execution instruction, and a movable control board provided in the conveying unit and adapted to receive the conveying operation execution instruction and to transmit an operation condition of the conveying unit to the control board. A pallet status display unit is further disposed in the control board and adapted to distinguish and display the status of the respective pallets independently in response to the pallet status display instruction from the control board.

6 Claims, 8 Drawing Sheets

FIG. 1

FIG. 2A Cal. Signal

FIG. 2B 1st Gate Signal / 3rd Gate Signal

FIG. 2C 2nd Gate Signal / 4th Gate Signal

FIG. 2D 1st Gate Signal / 4th Gate Signal

FIG. 2E 2nd Gate Signal / 3rd Gate Signal

PULSE SIGNAL MEASURING INSTRUMENT

FIELD OF THE INVENTION

This invention relates to a pulse signal measuring instrument which measures various pulse signal parameters such as the pulse width, the signal period of an input signal, and the time interval between two input signals. More particularly, the present invention relates to a pulse signal measuring instrument which is capable of measuring the pulse signal parameters with a high degree of accuracy and simplicity by automatically compensating the propagation time difference between the different signal paths in the circuit configuration of the measuring instrument.

BACKGROUND OF THE INVENTION

Figure 6:
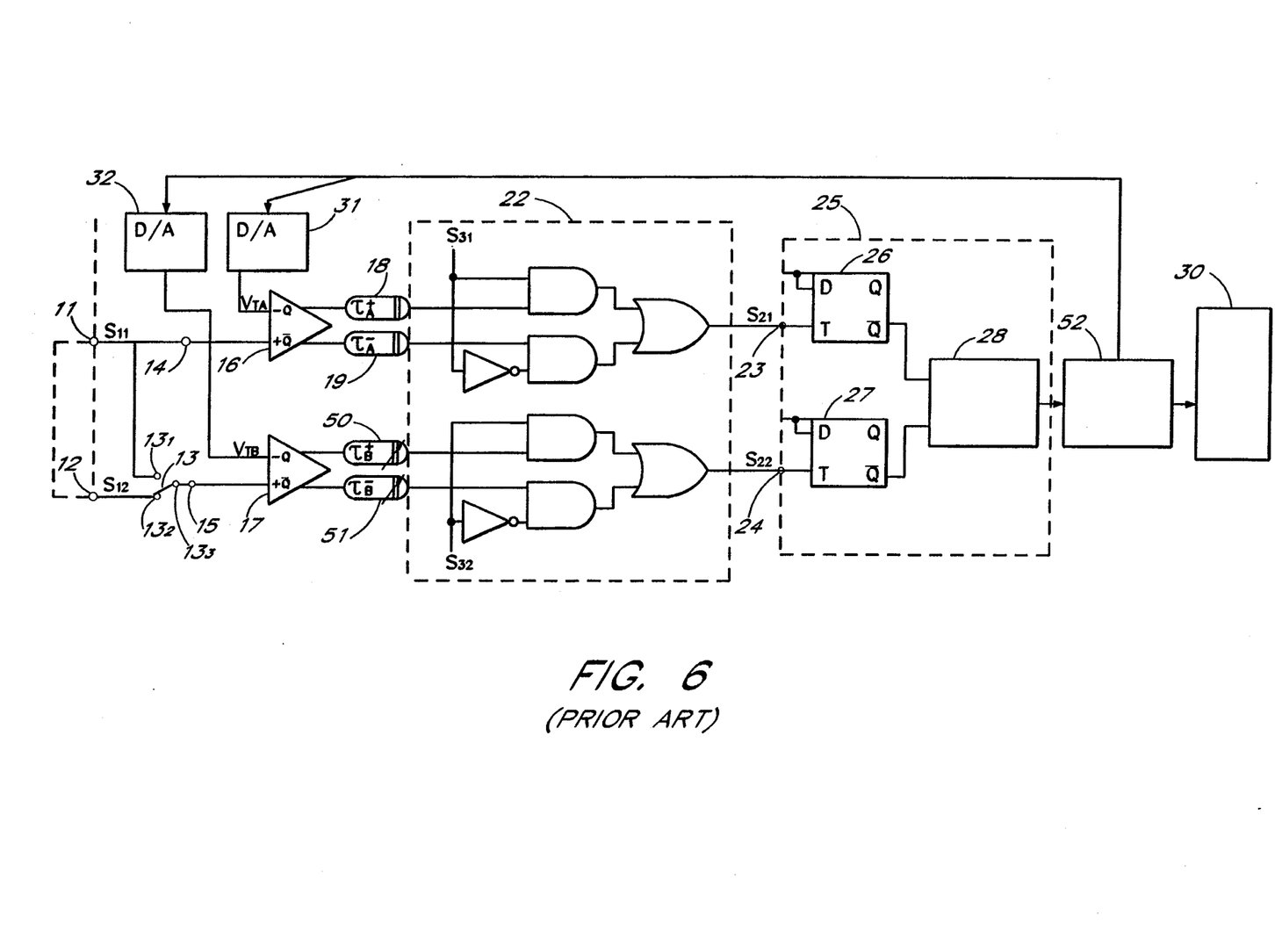
FIG. 6 shows the structure of a conventional pulse signal measuring instrument.
Figure 7A:
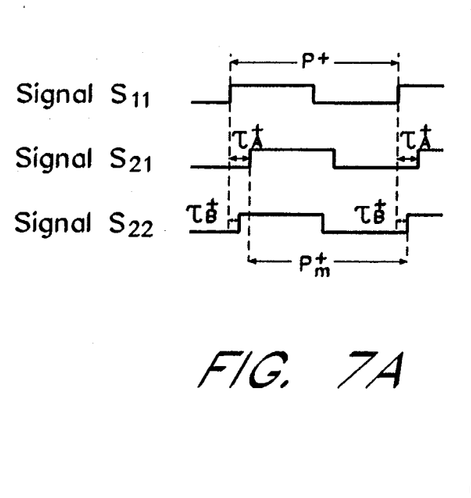
FIG. 7A is a timing chart illustrating the timing relationship of the positive signal period calibration for the conventional pulse signal measuring instrument of FIG. 6.
Figure 7B:
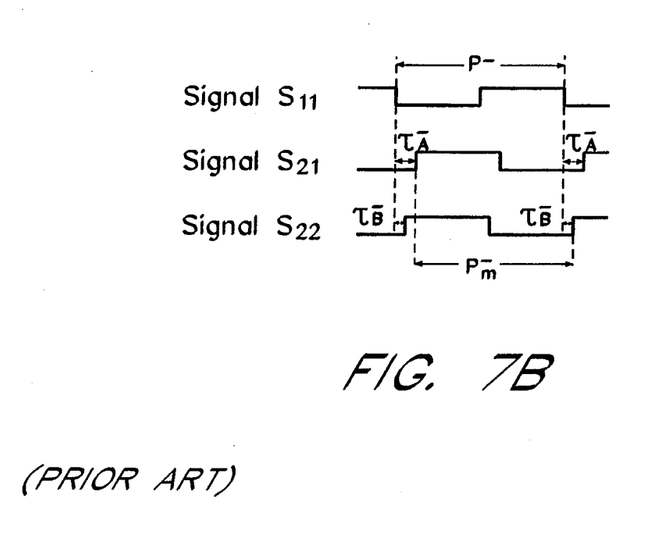
FIG. 7B is a timing chart illustrating the timing relationship of the negative signal period calibration for the conventional pulse signal measuring instrument of FIG. 6.

FIG. 6 illustrates an example of a conventional pulse signal measuring instrument ordinarily used to measure the pulse width and the signal period of an input signal, and the time interval between two input signals. FIG. 7A shows the timing diagram of each signal obtained during calibration of the conventional time interval measuring instrument for a signal period defined by positive edges. FIG. 7B shows the timing diagram of each signal obtained during calibration of the conventional time interval measuring instrument for a signal period defined by negative edges.

The conventional pulse measuring instrument generally is comprised of input terminals 11 and 12, a change-over switch 13, comparators 16 and 17, a gate circuit 22, a measuring part 25, a calculation part (CPU) 52, a display 30 and D/A converters 31 and 32. The measuring part 25 is made up of input terminals 23 and 24, D-type flip flops 26 and 27 and a time difference measuring circuit 28. The input terminal 11 where the pulse signal is supplied is connected to a noninverting input of the comparator 16 through a terminal 14. The input terminal 12 is connected to a noninverting input of the comparator 17 through the change-over switch 13 and a terminal 15. Inverting inputs of the comparators 16 and 17 are connected to outputs of the D/A converters 31 and 32 respectively. The change-over switch 13 has contacts $13_1$, $13_2$ and $13_3$. Contact $13_1$ is connected to the input terminal 11 and contact $13_2$ is connected to input terminal 12, respectively. Contact $13_3$ is connected to the noninverting input of the comparator 17. The D/A converters 31 and 32 respectively provide intermediate level voltages $V_{TA}$ and $V_{TB}$ to inverting inputs of the comparators 16 and 17. Each of the comparators has a noninverting output and an inverting output. Delay elements 18, 19, 50 and 51 are connected to the outputs of the comparators 16 and 17. The gate circuit 22 has a first gate circuit and a second gate circuit. The first gate circuit interchangeably provides either the noninverting output or the inverting output from the comparator 16 to the measuring part 25 in response to a control signal $S_{31}$. The second gate circuit interchangeably provides either the noninverting output or the inverting output from the comparator 17 to the measuring part 25 in response to a control signal $S_{32}$. Examples of the circuit configuration for the time difference measuring circuit 28 in the measuring part 25 is described in Japanese Patent Publication No. 63-3272 and Japanese Patent Laying-Open Publication No. 62-294993.

In the conventional pulse measuring instrument of FIG. 6, the change-over switch 13 and the control signals $S_{31}$ and $S_{32}$ are set as shown in Table 1, depending upon the measuring items and the edges of the input signals.

TABLE 1

| Measurement | Switch 13 | Signal $S_{31}$ | Signal $S_{32}$ |
|---|---|---|---|
| Positive edge signal period | Input terminal 11 | H | H |
| Negative edge signal period | Input terminal 11 | L | L |
| Positive pulse width | Input terminal 11 | H | L |
| Negative pulse width | Input terminal 11 | L | H |
| Positive edge time interval | Input terminal 12 | H | H |
| Negative edge time interval | Input terminal 12 | L | L |

In FIG. 6, there are three signal paths from the input terminals 11 and 12 to the terminals 14 and 15. The first path is a route from the input terminal 11 to the terminal 14. The second path is a route from the input terminal 11, to the change-over switch 13, to the terminal 15. The third path is a route from the input terminal 12, to the change-over switch 13, to the terminal 15. Signal propagation times in the above three paths are substantially identical. Usually, there is no difficulty in making the signal propagation times equal, since these signal paths are formed by small passive elements. However, there are significant amount of time differences between signal paths which include the comparators 16, 17 and the gate circuit 22. The delay elements 18, 19, 50, and 51, shown between the comparators 16 and 17 and the gate circuit 22, represent delay times, i.e., the signal propagation times in corresponding signal paths. Further, these delay elements indicate the signal propagation of times $\tau_A{}^+$, $\tau_A{}^-$, $\tau_B{}^+$, $\tau_B{}^-$ of the signal paths. The delay elements 18 and 19 do not necessarily need to be independent or discrete elements but, rather, they need to show the total amount of delay time in the corresponding signal paths. The delay elements 50 and 51 are formed of, for example, delay lines, typically coaxial cables.

In the example of FIG. 6, the signal propagation time in a signal path extending from the terminal 14, to the non-inverting output of the comparator 16, to the gate circuit 22, and, finally, to the input terminal 23, is designated as $\tau_A{}^+$. In contrast, the signal propagation time in a signal path extending from the terminal 14, to the inverting output of the comparator 16, and, finally, to the input terminal 23, is designated as $\tau_A{}^-$. Further, the signal propagation time in a signal path extending from the terminal 15, to the noninverting output of the comparator 17, to the gate circuit 22, and ending at the input terminal 24, is designated as $\tau_B{}^+$. However, the signal propagation time in a signal path extending from the terminal 15, to the inverting output of the comparator 17, to the gate circuit 22, terminating at the input terminal 24, is designated as $\tau_B{}^-$. The delay times in the delay elements 50 and 51 are variable by adjusting, for example, the cable length (not shown). The measuring part 25 is calibrated so that it can accurately measure the time difference between the positive edges of signal $S_{21}$ and $S_{22}$, which are input to input terminals 23 and 24, respectively.

When the change-over switch 13 is switched to the contact $13_1$, a pulse signal $S_{11}$ (which is to be measured) from input terminal 11 is supplied to the comparators 16 and 17. This is a typical situation for measuring the signal period and the pulse width of the input signal $S_{11}$. When the change-over switch 13 is switched to the contact $13_2$, two pulse signals are input to the input terminals 11 and 12, respectively. Thus, one of the pulse signals is supplied to the comparator 16 and the other pulse signal is supplied to the comparator 17. This is a situation for measuring the time interval between the two signals $S_{11}$ and $S_{12}$. The comparators 16 and 17 output the pulse signals by formatting the input signals into the square waves having sharp rising and falling edges. The output signals from each of the comparators 16 and 17 are in the inverting form and in the noninverting form. The output signals from the comparators 16 and 17 are sent to the gate circuit 22 in the form of signals $S_{21}$ and $S_{22}$. This selection is accomplished by the control signals $S_{31}$ and $S_{32}$ from the CPU 52. The signals $S_{21}$ and $S_{22}$ are input to the measuring part 25 through input terminals 23 and 24. The time difference measuring circuit 28 measures the time difference between the rising edges (positive edges) or the falling edges (negative edges) of the signals $S_{21}$ and $S_{22}$, which is either the signal period, the pulse width, or the time interval of the pulse signals. The CPU 52 instructs the display 30 to display the measured value.

In referring to FIGS. 6 and 7, the following is a procedure for calibrating a conventional pulse signal measuring instrument. First, the description is given regarding the calibration procedure for the measurement of the signal period between positive edges. In FIG. 7, it is assumed that the accurate values of the signal periods $P^+$ (FIG. 7A) and $P^-$ (FIG. 7B) of the calibration signals $S_{11}$ and $S_{12}$ are known. Further, $Pm^+$ represents the measured value of the positive edge signal period displayed on the display 30. Based on the waveforms in FIG. 7A, the following relationship is established between the measured value $Pm^+$ and the accurate (true) signal period $P^+$ of the calibration signal:

$$P^+ + \tau_B^+ = \tau_A^+ + Pm^+$$

$$Pm^+ = P^+ + \tau_B^+ - \tau_A^+ \quad (1)$$

From Equation (1), by adjusting the length of the coaxial cable (the delay element 50) to make the signal propagation time $\tau_B^+$ equal to the signal propagation time $\tau_A^+$, the measured value $Pm^+$ can be calibrated to the accurate signal period $P^+$. Thus, after this calibration, accurate measurement of signal period between positive edges for an input signal can be made using the pulse measuring instrument.

The calibration of signal period measurements taken between negative edges is performed in a manner similar to the above-described procedure. With reference to FIG. 7B, the signal period $Pm^-$ represents the measured value of the negative edge signal period displayed on the display 30. Based on the waveforms in FIG. 7B, the following relationship is established between the measured value $Pm^-$ and the accurate (true) signal period $P^-$:

$$P^- + \tau_B^- = \tau_A^- + Pm^-$$

$$Pm^- = P^- + \tau_B^- - \tau_A^- \quad (2)$$

From Equation (2), by adjusting the length of the coaxial cable (the delay element 51), thereby making the signal propagation time $\tau_B^-$ equal to the signal propagation time $\tau_A^-$, the measured value $Pm^+$ can be calibrated to the actual signal period $P^-$. Thus, after this calibration, accurate measurement of signal period between positive edges for an input signal can be made using the pulse measuring instrument.

Figure 8:
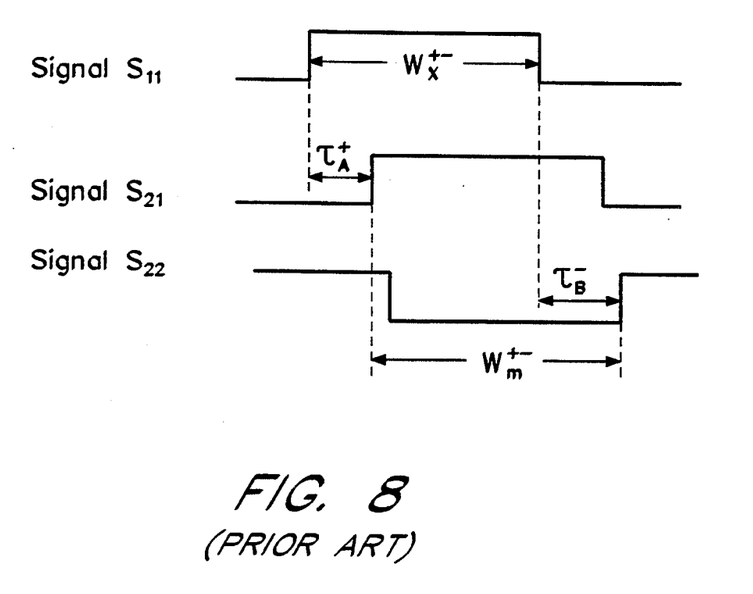
FIG. 8 illustrates the timing relationship of the positive pulse width calibration for the conventional pulse signal measuring instrument of FIG. 6.

The calibration of pulse width measurements is performed in a manner similar to the calibration of the signal period measurements, as described above. For example, FIG. 8 shows the timing relationship between the input calibration pulse and the internal pulse signals which are affected by the signal propagation times. The timing chart of FIG. 8 is directed to the calibration of positive pulse width measurements, wherein the relationship between the measured pulse width $Wm^{+-}$ and the accurate pulse width $Wx^{+-}$ is established as follows:

$$Wm^{+-} = Wx^{+-} + \tau_B^- - \tau_A^+ \quad (3)$$

Thus, in order to remove $(\tau_B^- - \tau_A^+)$ from Equation (3), the length of the coaxial cable (the delay element 51) is adjusted so that the propagation time $\tau_B^-$ is equal to the propagation time $\tau_A^+$. Similarly, in the calibration of negative pulse width $Wm^{-+}$ measurements, the signal propagation time $\tau_B^+$ is adjusted to be equal to the signal propagation time $\tau_A^-$.

In the above mentioned conventional pulse measuring instrument, the calibration is performed by adjusting the length of the coaxial cable (the delay elements 50 and 51) with reference to the propagation time differences between the two pairs of signal paths, i.e., the signal paths for the positive edges and the signal paths for the negative edges. However, this procedure is cumbersome and time consuming since this adjustment of propagation time is undertaken manually. In addition, even though the signal propagation times are accurately adjusted to $\tau_B^+ = \tau_A^+$ and $\tau_B^- = \tau_A^-$, the calibration will be affected by temperature changes and/or time intervals between calibrations. As a result, the signal propagation times may be affected by temperature changes or time intervals between calibrations. Therefore, it is difficult to maintain an accurate measurement for a reasonably long period of time. Furthermore, calibration of the pulse width measurement, as described above, requires a pulse generator having an accurate pulse width. However, although a pulse generator can usually generate a signal having an accurate signal period or frequency, it is difficult to generate a pulse signal having an accurate pulse width. Thus, such a pulse generator is either unavailable or extremely expensive.

SUMMARY OF THE INVENTION

Accordingly, the purpose of the present invention is to provide a pulse measuring instrument for measuring various pulse signal parameters, such as the pulse width, the signal period of an input signal, and the time interval between input signals. These measurements will be made with a high degree of accuracy and simplicity by automatically compensating the propagation time differences between the input signal paths in the circuit configuration contained within the measuring instrument.

The pulse signal measuring instrument of the present invention is first provided with a calibration signal at its input terminal to obtain calibration data. The calibration data includes various time difference data, which includes signal propagation time delays in the signal paths. The calibration data also includes the period of the calibration signal and the standard pulse width of the calibration signal. The calibration data, is stored in a computer in the pulse signal measuring instrument. After obtaining the calibration data, an input signal that is to be measured is applied to the input terminal of the pulse signal measuring instrument. The measured value of the input signal is compensated by the calibration data so that the propagation time difference is canceled.

The pulse signal measuring instrument of the present invention is also capable of calibrating the signal propagation time difference between signal probes connected to the input terminals. The calibration data, including the signal propagation time difference between the signal probes, is stored in the computer in the pulse signal measuring instrument. When the input signal to be measured is supplied through the signal probes, the measured value is compensated by the calibration data, which includes the propagation time difference between the signal probes.

The pulse signal measuring instrument of the present invention is capable of automatically selecting either the input signal or the calibration signal to be measured in the measuring instrument. The calibration signal is internally generated in the measuring instrument and supplied to the internal circuit of the measuring instrument through a change-over switch which selects either the input signal or the calibration signal based on the instruction from a controller in the measuring instrument. Thus, the calibration operation can be performed automatically with any desired time sequence.

According to the present invention, since the pulse signal measurement is performed after obtaining the calibration data and the measured data for the input signal is automatically compensated by the calibration data, pulse signal measurements can be accomplished with an extremely high degree of accuracy and efficiency.

BRIEF DESCRIPTION OF THE DRAWINGS

FIGS. 2A-2E are timing charts which show the timing relationship between the signals in the pulse signal measuring instrument of the present invention when the calibration process is undertaken.

FIGS. 3A-3F are timing charts which show the timing relationship between the signals in the pulse signal measuring instrument of the present invention when the pulse signal measurement process is undertaken.

DETAILED DESCRIPTION OF THE INVENTION

Figure 1:
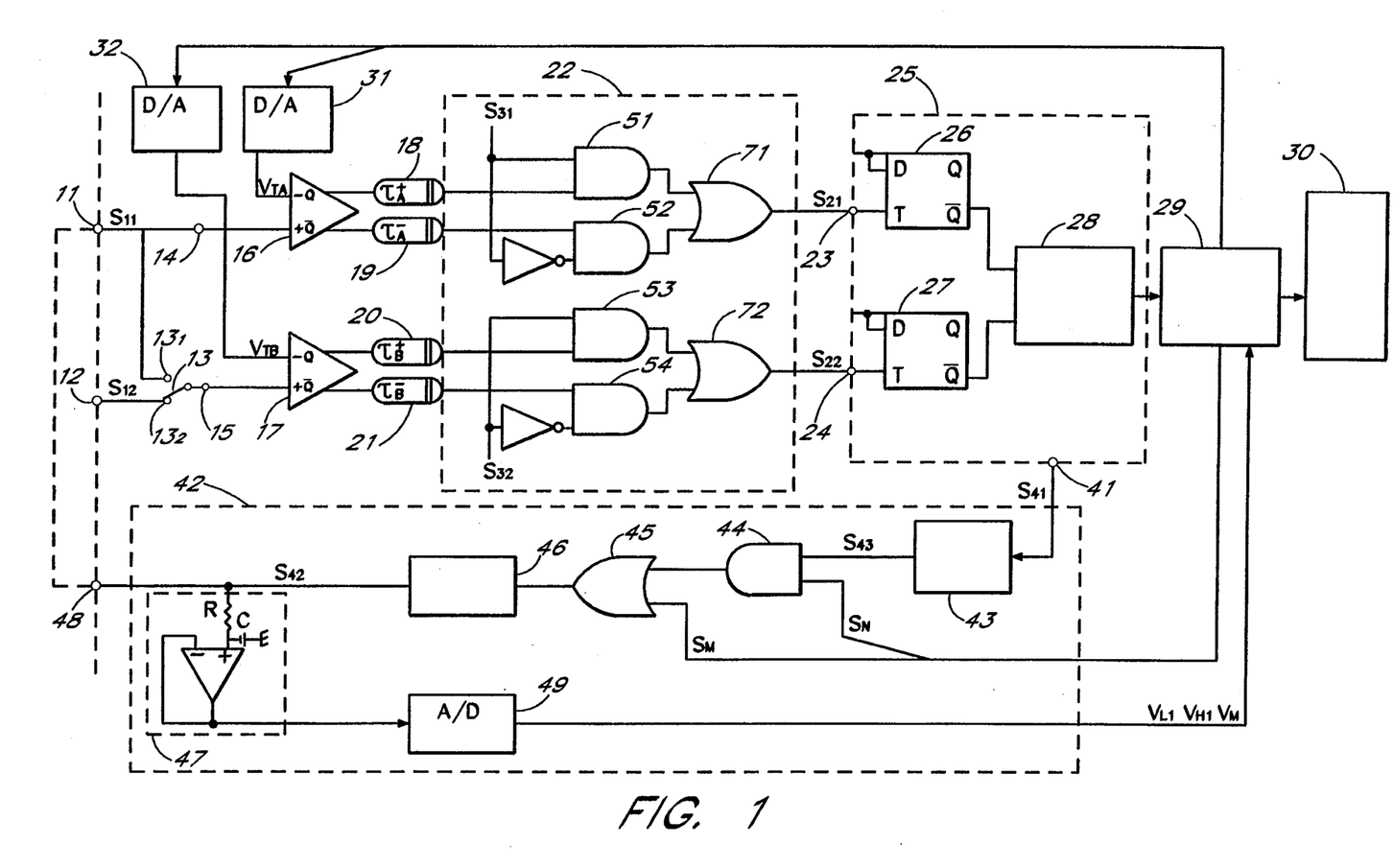
FIG. 1 is a diagram which shows the structure of the first embodiment of the pulse signal measuring instrument in accordance with the present invention.

In order to obtain a better understanding of the present invention, the principal theory of calibration by which the signal propagation time differences are measured and compensated will be discussed with reference to FIGS. 1-3. FIG. 1 shows the pulse signal measuring instrument of the present invention, the more detailed structure of which will be described later. In FIG. 1, the signal propagation times in four signal paths are represented in a similar manner to the conventional pulse signal measuring instrument of FIG. 6. Namely, the signal propagation time for a signal (hereinafter referred to as "first gate signal") passing through a signal path extending from the terminal 14, to the non-inverting output of the comparator 16, to an AND gate 51, to an OR gate 71, and finally to the input terminal 23, is designated as $\tau_A^+$. The signal propagation time for a signal (hereinafter referred to as "second gate signal") passing through a signal path extending from the terminal 14, to the inverting output of the comparator 16, to an AND gate 52, to the OR gate 71, and terminating at the input terminal 23, is designated as $\tau_A^-$. The signal propagation time for a signal (hereinafter referred to as "third gate signal") passing through a signal path extending from the terminal 15, to the non-inverting output of the comparator 17, to an AND gate 53, to an OR gate 72, and finally to the input terminal 24, is designated as $\tau_B^+$. The signal propagation time for a signal (hereinafter referred to as "fourth gate signal") passing through a signal path extending from the terminal 15, to, the inverting output of the comparator 17, to an AND gate 54, to the OR gate 72, and terminating at the input terminal 24, is designated as $\tau_B^-$.

FIG. 2 is a timing chart which shows the timing relationship between the signals in the pulse signal measuring instrument of the present invention during the calibration process. FIG. 2A is a waveform of the calibration input signal to be used during the calibration procedure of the present invention. FIG. 3 is a timing chart which shows the timing relationship between the signals in the pulse signal measuring instrument of the present invention during the signal measurement process.

Figure 2A:
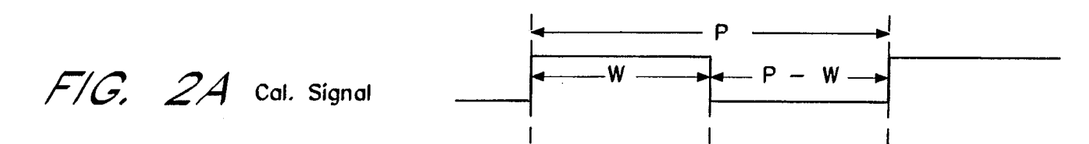
FIG. 2A shows the calibration signal supplied to the input terminal for the purpose of calibration.

The calibration signal of FIG. 2A is provided at the input terminal of the pulse signal measuring instrument. During the calibration process, the change-over switch 13 is set to the contact 13$_1$ so that the calibration signal can propagate in the four signal paths, as previously described. The calibration signal has a signal period P and a pulse width W. Thus, a duty ratio D of the calibration signal is expressed by W/P. The low level voltage $V_L$ and the high level voltage $V_H$ of the calibrated signal are measured, for example, by an average voltage measuring circuit. Additionally, the average voltage $V_M$ of the calibration signal (average voltage of the square wave signal) is also measured. These measured voltages are digitized by an A/D (analog-digital) converter as VL and stored in a CPU in the pulse measuring instrument. The duty ratio in the calibration signal may be expressed by the digital value $V_L$, $V_H$, $V_M$ as follows:

$$D=(V_M-V_L)/(V_H-V_L) \quad (4)$$

Since the duty ration D=W/P, where P is the signal period and W is the pulse width, it therefore follows that the pulse width W=PD. Therefore, the pulse width W of the calibration signal of FIG. 2A may be expressed as follows:

$$W=P(V_M-V_L)/(V_H-V_L) \quad (5)$$

The calculation of the pulse width W based on Equation (5) is performed by the CPU in the pulse signal measuring instrument and stored therein as a standard pulse width.

Figure 2B:
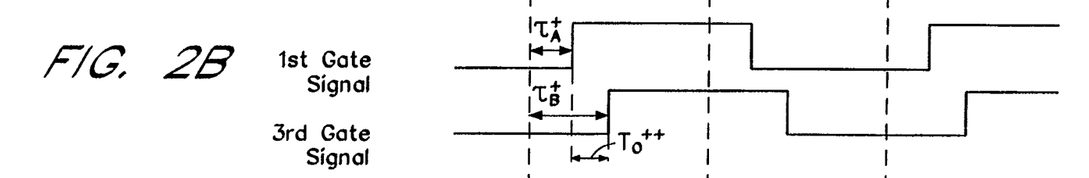
FIGS. 2B-2E show the timing relationship between the positive edges, negative edges, positive and negative edges, and negative and positive edges of the calibration signal, respectively.
Figure 2C:
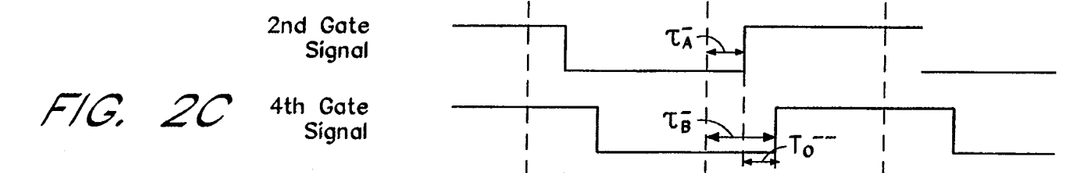
Figure 2D:
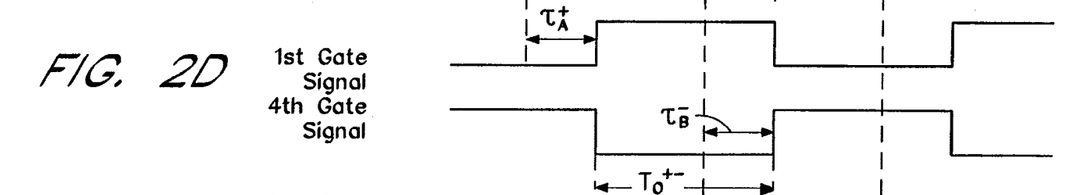
Figure 2E:
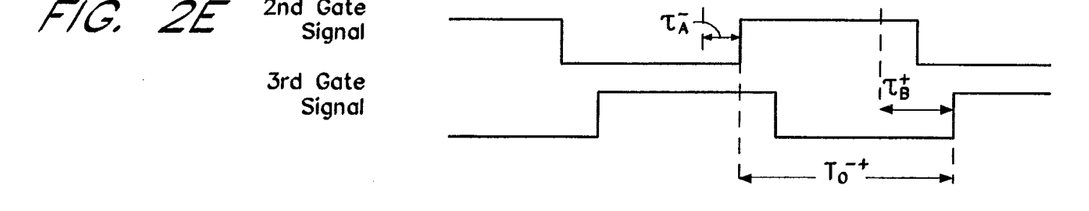

The calibration procedure continues wherein the positive edge time interval, the negative edge time interval, the positive pulse width and the negative pulse width are measured for the calibration signal of FIG. 2A. In the measurement of the positive edge time interval, time difference $To^{++}$ between the first gate signal and the third gate signal is measured (FIG. 2B). The time difference $To^{++}$ involves the signal propagation times $\tau_A^+$ and $\tau_B^+$. In the measurement of the negative edge time interval, time difference $To^{--}$ between the second gate signal and the fourth gate signal is measured (FIG. 2C). The resultant time difference $To^{--}$ involves the signal propagation times $\tau_A^-$ and $\tau_B^-$. In the measurement of the positive pulse width, time difference $To^{+-}$ between the first gate signal and the fourth gate signal is measured (FIG. 2D). The resultant time difference $To^{+-}$ involves the signal propagation times $\tau_A^+$ and $\tau_B^-$ and the standard pulse width W. In the measurement of the negative pulse width, time difference $To^{-+}$ between the first gate signal and the fourth gate signal is measured (FIG. 2E). The resultant time difference $To^{-+}$ involves the signal propagation times $\tau_A^-$, $\tau_B^+$, the standard pulse width W and the signal period P, as shown in Table 2. The previously described results are summarized in Table 2.

TABLE 2

| Measurement | Value | Time Difference | Fig |
|---|---|---|---|
| Positive edge time interval | $To^{++}$ | $\tau_A^+ - \tau_B^+ = -To^{++}$ | 2B |
| Negative edge time interval | $To^{--}$ | $\tau_A^- - \tau_B^- = -To^{--}$ | 2C |
| Positive pulse width | $To^{+-}$ | $\tau_A^+ - \tau_B^- = W - To^{+-}$ | 2D |
| Negative pulse width | $To^{-+}$ | $\tau_A^- - \tau_B^+ = P - W - To^{-+}$ | 2E |

After the foregoing procedure, an input pulse signal to be measured is supplied at the input terminal of the pulse signal measuring instrument. In this measuring operation, the change-over switch 13 is set in the same way as listed in Table 1 depending on the kind of measurement.

For the measurement of the positive edge signal period, defined as the time between the first positive and the next positive edge of the input signal, the time difference Tm between the first and third gate signals is measured. For the measurement of the negative edge signal period, defined as the time between the first and the second negative edges of the input signal, the time difference Tm between the second and fourth gate signals is measured.

For the measurement of the positive pulse width, defined as the time between the positive edge and negative edges of the input signal, the time difference Tm between the first and fourth gate signals is measured. For the measurement of the negative pulse width, defined as the time between the negative and positive edges of the input signal, the time difference Tm between the second and third gate signals is measured.

In measuring the time interval, two input signals are supplied to the input terminals 11 and 12, respectively. Thus, the change-over switch 13 is set to the contact $13_2$ this time. For the measurement of the positive edge time interval, defined as the time between the positive edges of the first input signal and the second input signal, the time difference Tm between the first and third gate signals is measured. For the measurement of the negative edge time interval, as the time between the negative edges of the first input signal and the second input signal, the time difference Tm between the second and fourth gate signals is measured.

The measured value Tm in each of the previously described measurements is related to the true value of the input signals. This can be expressed by using the calibration results of Table 2 as summarized in Table 3. In Table 3, $Px^+$ designate the true value of the signal period of the input pulse signal. $Px^-$ designates the true value of the signal period of the input pulse signal. $Wx^+$ designates the true value of the positive pulse width of the input pulse signal. $Wx^-$ designates the true value of the negative pulse width of the input pulse signal. $Tx^{++}$ designates the true value of the positive edge time interval of the input pulse signals. Finally, $Tx^{--}$ designates the true value of the negative edge time interval of the input pulse signals. Therefore, the true values of the input pulse signals are expressed by the measured values Tm in combination with the values obtained in the calibration process in Table 2. In table 3, each measurement relationship is listed with reference to FIGS. A-F.

TABLE 3

| Measurement | Relationship | Figure |
|---|---|---|
| Positive edge signal period | $Px^+ - Tm = \tau_A^+ - \tau_B^+$ <br> $= Tm - To^{++}$ | 3A |
| Negative edge signal period | $Px^- = Tm + \tau_A^- - \tau_B^-$ <br> $= Tm - To^{--}$ | 3B |
| Positive pulse width | $Wx^+ = Tm + \tau_A^+ - \tau_B^-$ <br> $= Tm + W - To^{+-}$ | 3C |
| Negative pulse width | $Wx^- = Tm + \tau_A^- - \tau_B^+$ <br> $= Tm + P - W - To^{-+}$ | 3D |
| Positive edge time interval | $Tx^{++} = Tm + \tau_A^+ - \tau_B^+$ <br> $= Tm - To^{++}$ | 3E |
| Negative edge time interval | $Tx^{--} = Tm + \tau_A^- - \tau_B^-$ <br> $= Tm - To^{--}$ | 3F |

By storing the calibration data, shown in Table 2, as correction data, the true value of the input pulse signal can be obtained through computer based calculations. These results are shown in Table 3. Therefore, the pulse signal measuring instrument of the present invention can measure the input pulse signal with a high degree of accuracy.

FIG. 1 is a block diagram showing one embodiment of the structure of the pulse measuring instrument in accordance with the present invention. In FIGS. 1 and 6, like numerals are used to designate similar components.

The pulse signal measuring instrument of FIG. 1 includes a calibration signal generator 42 used to obtain the calibration data shown in Table 2. The operation of CPU 29 is different from that of CPU 52 since it involves different calibration and compensation processes. Delay elements 20 and 21, shown between the comparator 17 and the gate circuit 22, are different from the delay elements 50 and 51 of FIG. 6. The signal propagation times $\tau_A^+$ and $\tau_B^-$ are fixed and no longer variable. The calibrated signal generator 42 is composed of the following components: a divider 43, an AND gate 44, an OR gate 45, a wave formatter 46, an average voltage detecting circuit 47, an A/D (analog-digital) converter 49 and an output terminal 48. The divider 43 is provided with a clock signal $S_{41}$ having a known signal period Po from the measuring part 25. The clock $S_{41}$ can be replaced with any square wave signals having a constant signal period, such as an internal reference clock signal in the measuring instrument.

The divider 43 divides the clock signal $S_{41}$ by 1/n and outputs a square shape signal clock $S_{43}$ having a signal period nPo. The And gate 44 provides the divided clock signal $S_{43}$ to the OR gate 45 when a control signal $S_N$ from the CPU 29 is high. The OR gate 45 provides either an output signal from the AND gate 44 or a control signal $S_M$ from the CPU to the wave formatter 46. The wave formatter 46 generates a calibration signal $S_{42}$ to the average voltage detecting circuit 47 and the output terminal 48. The average voltage detecting circuit 47 detects and measures the average voltage of the calibrated signal $S_{42}$ from the wave formatter 46.

The dividing ratio of the divider 43 is determined so that the frequency of the calibration signal $S_{42}$ can be adjusted to the highest sensitivity range for the average voltage detecting circuit 47. Therefore, if the frequency of the clock signal $S_{41}$ is adequate for the highest sensitivity in the average voltage detecting circuit 47, then divider 43 is unnecessary. The wave formatter 46 generates the calibration signal $S_{42}$ having sharp rising and falling edges with minimum overshoot and undershoot. Such a wave formatter may be constructed by a Schmitt trigger circuit, a comparator, a retiming circuit, or the like. The wave formatter preferably has highly accurate voltage references to determine high and low output voltages. A time constant RC in the average voltage detecting circuit 47 is preferably selected to be RC>>nPo. The comparators 16 and 17 are provided with the intermediate level voltages $V_{TA}$ and $V_{TB}$ from the D/A converters 31 and 32 as reference voltages for an input signal, i.e., a threshold voltage for the comparators to change states depending on the voltage level of the input signal. Throughout this description, it is assumed that timing errors in the comparators 16 and 17 with respect to the intermediate level voltages $V_{TA}$ and $V_{TB}$ are negligible.

In operation, the calibration signal $S_{42}$ is supplied to the input terminal 11 through the output terminal 48, as shown in the dotted line of FIG. 1. The CPU 29 generates the control signals $S_N$ and $S_M$, both of which are low level. As a result, the output of OR gate 45 becomes low level, since the output of the AND gate 44 is also low level. Thus, the calibration signal $S_{42}$, which is the output of the wave formatter 46, also becomes low level (DC voltage). The average voltage detecting circuit detects this low level voltage and provides this voltage to the A/D converter 49. The A/D converter 49 converts the low level voltage to the digital value $V_L$ and outputs the digital value to the CPU 29.

Next, the CPU 29 outputs the control signal $S_N$, which is still low level, and the control signal $S_M$, which is now changed to high level. As a consequence, the output of the OR gate 45 becomes high level, since the input from the AND gate is fixed to the high level. Thus, the calibration signal $S_{42}$, which is the output of the wave formatter 46, becomes high level (DC voltage). The average voltage detecting circuit detects this high level voltage and provides this voltage to the A/D converter 49. The A/D converter 49 converts the high level voltage to digital value $V_H$ and outputs the digital value to the CPU 29.

The digital value $V_L$, for the low level of the calibration signal, and the digital value $V_H$, of the high level of the calibration signal, are thus obtained. The CPU 29 calculates $(V_L+V_H)/2$ to determine the intermediate level voltages, $V_{TA}$ and $V_{TB}$, for the D/A converters 31 and 32. Based on this calculation, the D/A converters 31 and 32 provide the intermediate level voltages, $V_{TA}$ and $V_{TB}$, to the inverting inputs of the comparators 16 and 17, respectively. Next, the CPU 29 changes the control signal $S_N$ to the high level and the control signal $S_M$ to the low level. As a result, the OR gate 45 transmits the clock signal $S_{43}$, having the signal period nPo, from the divider 43 to the formatter 46. The clock signal $S_{43}$ is wave-shaped by the formatter 46 to generate the calibration signal $S_{42}$, which has the precise output levels (the low level $V_L$ and the high level $V_H$) and the signal period nPo. The average voltage detecting circuit 47 detects the average value of the square shaped calibration signal $S_{42}$ and transmits the average value to the A/D converter 49. The A/D converter generates the corresponding digital value $V_M$ and provides the digital value to the CPU 29.

The CPU 29 calculates the duty ratio D of the calibration signal $S_{42}$ from the digital values $V_L$, $V_H$, and $V_M$ using the aforementioned relationship in Equation (4). With the signal period of the calibration signal $S_{42}$ known, the positive pulse width W can be calculated based on the aforementioned relationship in Equation (5). The standard pulse width W and the signal period nPo are stored in the CPU 29.

During the measurement of the calibration signal $S_{42}$, the pulse measuring instrument of the present invention also obtains data regarding the propagation time differences in the signal paths, as discussed with respect to FIG. 2 and Table 2. For example, in the calibration of the measurement of positive pulse width, the relationship $\tau_A^+ - \tau_B^- = W - T_0^{+-}$, in Table 2, is calculated by measuring the positive pulse width $T_0^{+-}$ of the calibration signal $S_{42}$ as in FIG. 2A, and also utilizing the standard pulse width W, as calculated above. This relationship is stored in the CPU 29 and will later be used to compensate the data of the measured positive pulse width of an input pulse signal.

After the calibration process, an input pulse signal $S_{11}$ that is to be measured is supplied at the input terminal 11. For the positive pulse width measurement, the change-over switch 13 is connected to the contact $13_1$. Therefore, the input pulse signal $S_{11}$ is transmitted to the input of the comparators 16 and 17. The comparators 16 and 17 wave-shape the input pulse signal $S_{11}$ into a non-inverting square shape signal and an inverting square shape signal, both of which have sharp rising edges and falling edges. The voltage levels (the intermediate level voltages $V_{TA}$ and $V_{TB}$) for determining the rising and falling edges of the input signal are given by the D/A converters 31 and 32. The output of the comparators 16 and 17 are connected to the gate circuit 22 through the delay elements 18–21.

The CPU 29 supplies the control signals $S_{31}$ and $S_{32}$ to the gate circuit 22 to control the selection of signal paths in the gate circuit 22. In the case of measuring the positive pulse width, the control signal $S_{31}$ is set to a high level while the control signal $S_{32}$ is set to a low level. Thus, the first gate signal and the fourth gate signal are, respectively, provided to the measuring part 25. The first gate signal (i.e., the input signal passing through the comparator 16, to the delay element 18, to the AND gate 51 and, finally, to the OR gate 71) is provided at the input terminal 23 as a measuring signal $S_{21}$. The third gate signal (the input signal passing through the comparator 17, to the delay element 21, to the AND gate 54 and terminating at the OR gate 72) is provided at the input terminal 24 as a measuring signal $S_{22}$.

Figure 3A:
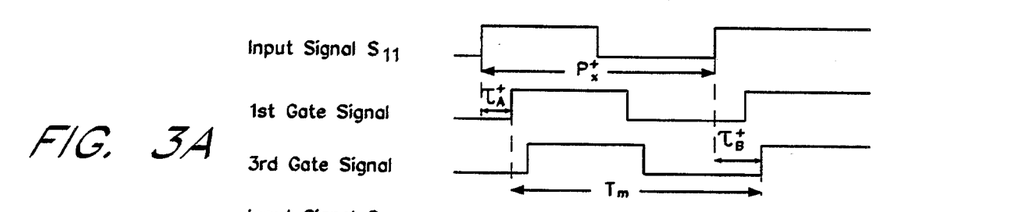
FIGS. 3A and 3B are timing charts for the measurement of signal period.
Figure 3B:
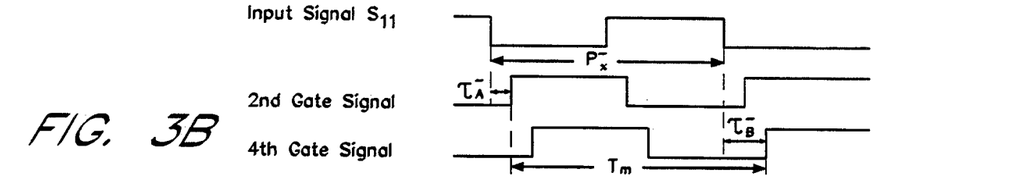
Figure 3C:
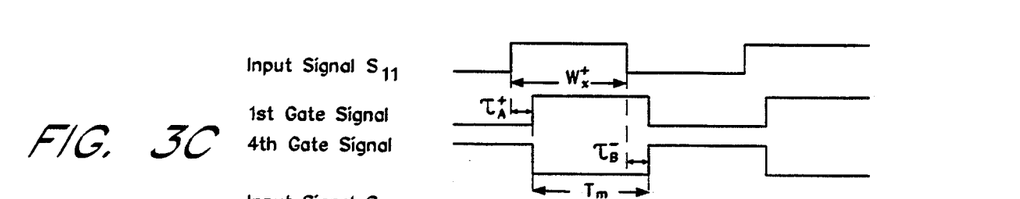
FIGS. 3C and 3D are timing charts for the measurement of pulse width.
Figure 3D:
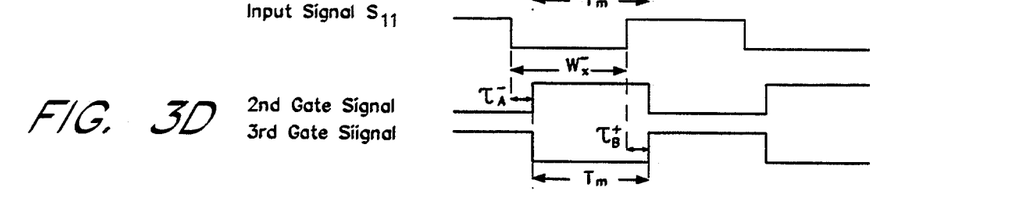
Figure 3E:
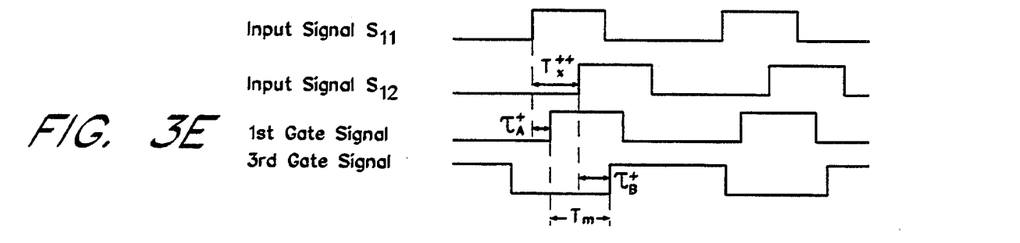
FIGS. 3E and 3F are timing charts for the measurement of time interval.
Figure 3F:
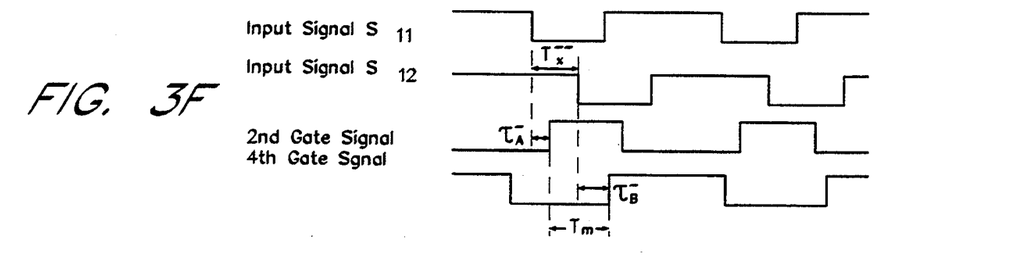

As shown in FIG. 3C, the measuring part 25 measures the time difference Tm between the rising edges of the signals $S_{21}$ and $S_{22}$ for evaluating the positive pulse width $Wx^+$ of the input pulse signal. Also, as shown in Table 3, the positive pulse width $Wx^+$ of the input signal is equal to $(Tm+W-To^{+-})$. The calibration data $(W-To^{+-})$ has been stored in the CPU 29. Thus, the CPU 29 compensates the measured data Tm by using the calibration data $(W-To^{+-})$ and provides the result to the display 30. The display 30 displays the true value of the positive pulse width of the input signal.

The above explanation relates to the measurement of the positive pulse width. By obtaining the corresponding calibration data, shown in Table 2, it is apparent that the true value for the other measurements, of the input pulse signal is also possible using the present invention. For example, in the measurement of positive edge signal period, the calibration data $To^{++}$, which is the time difference between the positive edges of the calibration signal as shown in FIG. 2B, is measured prior to the measurement of the input signal. Next, the input pulse signal to be measured is supplied to the pulse signal measuring instrument of the present invention. Finally, the time difference Tm, as shown in FIG. 3A, is obtained. The true value $Px^+$ of the positive signal period is calculated by CPU 29 based on the relationship $Px^{++}=Tm-To^{++}$, shown in Table 3. Similarly, the negative edge signal period, the positive edge time interval, the negative edge time interval and the negative pulse width are measured with a remarkably high degree of accuracy.

Figure 4:
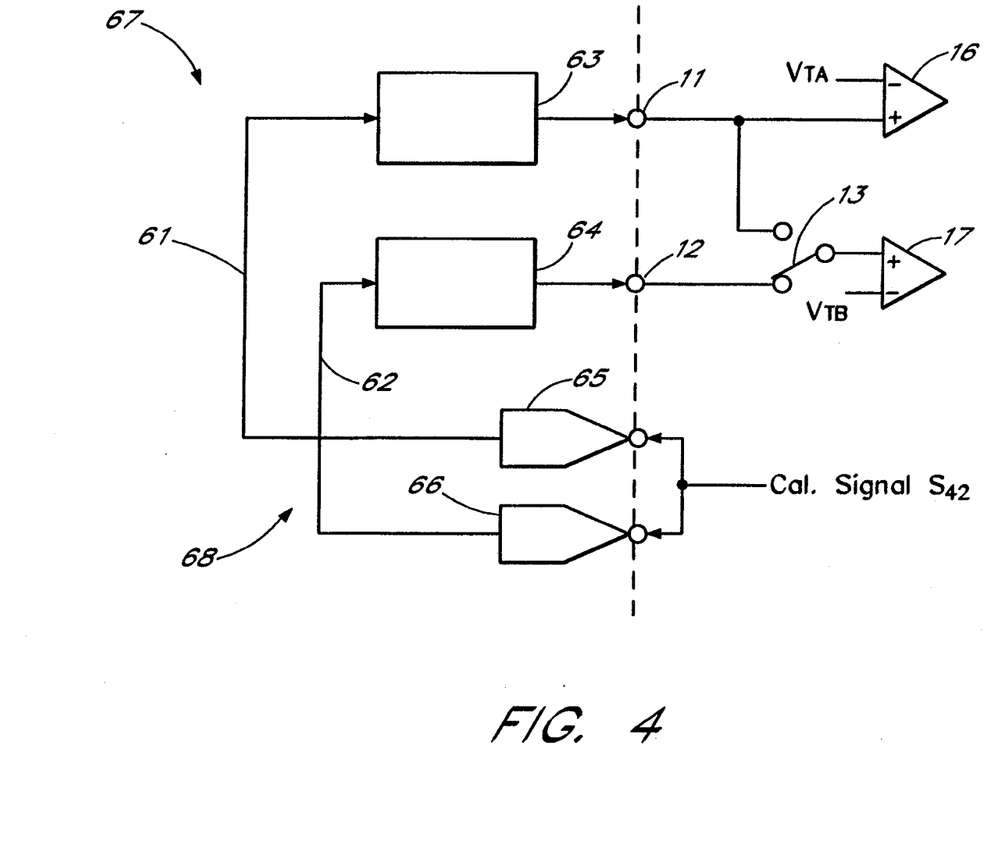
FIG. 4 is a diagram which shows the structure for calibrating the propagation time difference when using signal probes in the embodiment of FIG. 1.

FIG. 4 shows the connection for the calibration of the signal propagation time difference between signal probes when the signal probes are used at the input terminal of the pulse signal measuring instrument of the present invention. In many instances, it is preferable to measure an electric signal using a signal probe, since the signal probe can pick-up the electric signal without affecting the operation of the other electric circuit. In FIG. 4, signal probes 67 and 68 are connected to the input terminals 11 and 12, respectively. The signal probe 67 is composed of a cable 61, a probe interior circuit 63 and a hook 65, and the signal probe 68 is composed of a cable 62, a probe interior circuit 64 and a hook 66.

When two signal probes are used for measuring the time interval of the electric signals, for example, the signal propagation time difference between the two probes is a major factor to cause inaccuracy in the measurement. Thus, it is necessary to calibrate the signal propagation time difference of the probes before providing input signals to be measured to the probes. In the present invention, such calibration is easily accomplished by supplying the calibration signal to the hooks 65 and 66 of the probes 67 and 68 at the same time as shown in FIG. 4. In this setting, the signal propagation time $\tau_A^+$, $\tau_B^+$, $\tau_A^-$ and $\tau_B^-$ as discussed above include the signal propagation time of the probes 67 and 68. Thus, the possible inaccuracy derived from the time difference between the probes is compensated by the CPU 29 based on the relationship in Table 3. In case where the signal probes 67 and 68 attenuate the input signals, the corresponding attenuation ratio should also be provided to the threshold voltages $V_{TA}$ and $V_{TB}$ for the comparators 16 and 17. For example, if the attenuation ration of the signal probes 67 and 68 is 1/10, it is necessary to instruct the D/A converters 31 and 32 to reduce the threshold voltages $V_{TA}$ and $V_{TB}$ in the inverting inputs of the comparators 16 and 17 by 1/10.

Figure 5:
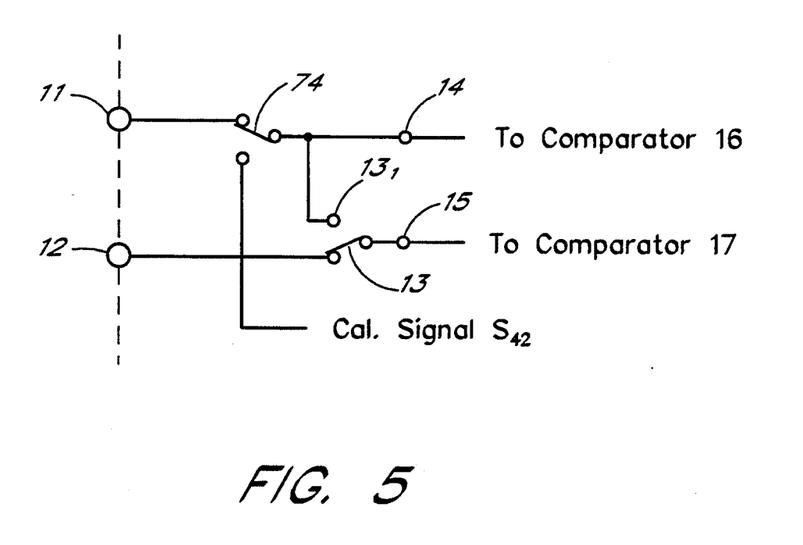
FIG. 5 shows the partial structure of the second embodiment of the pulse signal measuring instrument in accordance with the present invention.

FIG. 5 shows the partial structure of the second embodiment of the pulse signal measuring instrument in accordance with the present invention. In this embodiment, an additional change-over switch 74 is employed between the input terminal 11 and the comparators 16 and 17. In this structure, the change-over switch 74 can selectively provides either one of the input signal or the calibration signal $S_{42}$ to the comparators 16 and 17. Therefore, the CPU 29 can conduct the calibration operation automatically with desired sequence or repitition rate by controlling the switching of the change-over switch 74. For example, the calibration operation can be performed at every fixed time interval or at prior to every measurement.

As previously discussed, the present invention enables one to obtain highly accurate pulse signal measurements without being affected by the difference of signal propagation times in the pulse signal measuring instrument or the probes attached to the pulse signal measuring instrument used to measure the pick-up signals. The pulse signal measuring instrument obtain the calibration data using the calibration signal. The measured data is compensated by using the calibration data so that the true value of the input signal. Furthermore, the pulse signal measuring instrument in accordance with the present invention can automatically select either the input signal to be measured or the calibration for obtaining the calibration data, the calibration data operation performed with any desired time sequence.

What is claimed is:

1. A pulse signal measuring instrument apparatus for measuring pulse signal parameters of an input pulse signal, comprising:

an input terminal which receives an input signal or a calibration signal, first and second comparators provided with threshold voltages for changing the signal from said input terminal to square waves having sharp rising and falling edges, each of said comparators generates said square waves at an inverting output and a noninverting output;

a first gate circuit for receiving said square waves from said inverting output and said noninverting output of said first comparator and selectively output either one of said noninverting output or said inverting output;

a second gate circuit for receiving said square waves from said inverting output and said noninverting output of said second comparator and selectively output either one of said noninverting output or said inverting output;

a time difference measuring circuit for measuring the time difference between positive edges or negative edges of said output from said first gate circuit and said output from said second gate circuit;

a calibration signal generator for generating said calibration signal having a known signal period;

a controller for controlling a calibration operation wherein said calibration signal is provided to said input terminal to obtain calibration data including information on time differences between signal paths in the measuring instrument, said signal period and a standard pulse width of said calibration signal, said controller controlling a subsequent operation for signal measurement wherein said signal parameters are compensated by said calibration data.

2. A pulse signal measuring instrument as defined in claim 1 wherein said calibration signal generator;

a wave formatter for wave shaping a reference signal having a stable signal period P to generate said calibration signal, said wave formatter forming a high level voltage $V_H$ and a low level voltage $V_H$ of said calibration signal;

an average voltage detector for measuring said high level voltage $V_H$ and said low level voltage $V_H$ of said calibration signal and an average voltage $V_M$ of said calibration signal;

an analog to digital converter to convert the measured voltages in said average detector into digital data and transfer said digital data to said controller.

3. A pulse signal measuring instrument as defined in claim 1 further including another input terminal for receiving an input signal, said measuring instrument measures a time interval between input signals connected to said input terminal and said another input terminal.

4. A pulse signal measuring instrument as defined in claim 3, characterized in that a pair of signal probes for picking-up an electric signals from an electric circuit are connected to said input terminals, said pair of probes being provided with said calibration signal to obtain said calibration data prior to signal measurement so that the propagation time difference between said pair of probes is compensated by said controller based on said calibration data.

5. A pulse signal measuring instrument as defined in claim 2, characterized in that said controller calculates said standard pulse width of said calibration signal W by $W = P(V_M - V_L)/(V_H - V_L)$ where P is a signal period, $V_H$ is a high level voltage, $V_L$ is a low level voltage and $V_M$ is an average voltage of said calibration signal.

6. A pulse signal measuring instrument as defined in claim 1 further including a change-over switch for selectively supplying either said input signal or said calibration signal to said first and second comparators.

* * * * *